United States Patent
Endo et al.

(10) Patent No.: US 6,788,052 B2
(45) Date of Patent: Sep. 7, 2004

(54) MAGNETIC SENSOR APPARATUS CAPABLE OF DIRECTLY PRODUCING DIGITAL SENSOR DATA FROM MAGNETIC SENSOR ELEMENT

(75) Inventors: Noboru Endo, Okazaki (JP); Yasuaki Makino, Okazaki (JP)

(73) Assignee: Denso Corporation, Kariya (JP)

( * ) Notice: Subject to any disclaimer, the term of this patent is extended or adjusted under 35 U.S.C. 154(b) by 0 days.

(21) Appl. No.: 10/393,276

(22) Filed: Mar. 21, 2003

(65) Prior Publication Data

US 2003/0184290 A1 Oct. 2, 2003

(30) Foreign Application Priority Data

Mar. 26, 2002 (JP) ........................................ 2002-085156

(51) Int. Cl.[7] .............................................. G01R 33/02
(52) U.S. Cl. ...................................... 324/252; 324/251
(58) Field of Search ................................ 324/251–252, 324/260; 341/15; 315/171, 177

(56) References Cited

U.S. PATENT DOCUMENTS

| | | |
|---|---|---|
| 5,396,247 A | 3/1995 | Watanabe et al. |
| 5,525,899 A | 6/1996 | Watanabe et al. |
| 5,619,134 A | 4/1997 | Watanabe et al. |
| 5,760,581 A | 6/1998 | Kalb, Jr. |
| 6,452,239 B1 * | 9/2002 | McDowell et al. ......... 257/421 |

OTHER PUBLICATIONS

Kawahito et al., "A High–Resolution Integrated Magnetic Sensor Using Chopper–Stabilized Amplification", *Technical Digest of the 12th sensor symposium*, 1994, pp. 205–208.

* cited by examiner

*Primary Examiner*—Bot LeDynh
(74) *Attorney, Agent, or Firm*—Posz & Bethards, PLC

(57) ABSTRACT

A magnetic sensor apparatus has a ring circuit constructed with an odd number of semiconductor magnetic sensors connected in a ring shape. The drain regions of each magnetic sensor are separated from each other, so that currents flowing into the drain regions vary corresponding to the magnitude of the applied magnetic field. The semiconductor magnetic sensors function as inverters and inverting operations thereof cause time delay variable with the magnetic field strength. Digital data indicating a propagation condition of a pulse signal within the ring circuit correspond to the magnetic field.

8 Claims, 4 Drawing Sheets

MAGNETIC SENSOR APPARATUS CAPABLE OF DIRECTLY PRODUCING DIGITAL SENSOR DATA FROM MAGNETIC SENSOR ELEMENT

CROSS REFERENCE TO RELATED APPLICATION

This application is based on and incorporates herein by reference Japanese patent application No. 2002-85156 filed on Mar. 26, 2002.

FIELD OF THE INVENTION

The present invention is relates to a magnetic sensor apparatus for detecting magnetic field strengths. More specifically, the present invention is directed to a magnetic sensor apparatus capable of directly producing digital sensor data from a magnetic sensor element without using an A/D converter.

BACKGROUND OF THE INVENTION

Conventionally, Hall-effect elements for detecting magnetic field strengths are used as magnetic sensor elements. When a magnetic field is applied to a Hall-effect element, this element outputs a voltage in an analog value in response to the strength of the applied magnetic field. Since a characteristic of this Hall-effect element varies, the sensitivities, offset, temperature characteristics of this Hall-effect element are required to be adjusted by a sensor signal processing circuit. In other words, in this sensor signal processing circuit, an analog voltage output from the Hall-effect element is adjusted by either an analog circuit or a digital circuit, so that such a sensor output is produced after its offset and temperature characteristic have been corrected.

In this case, in order that the analog voltage output of the Hall-effect element is adjusted by the digital circuit, this analog voltage output must be converted into a digital voltage signal by employing an A/D converter. Also, even in a case that the adjustments of the analog voltage output from the Hall-effect element are carried out by employing analog circuits, an electronic control apparatus is operated in a substantially digital manner by which the sensor signal of this Hall-effect element is finally acquired and then is processed by a predetermined process operation. As a consequence, this sensor signal must be eventually converted to a digital signal by the A/D converter. Since the A/D converter must be built in the sensor signal processing circuit, manufacturing cost of the sensor signal processing circuit increases.

SUMMARY OF THE INVENTION

The present invention has been made to solve the above drawbacks, and has an object to provide a magnetic sensor apparatus capable of directly producing a digital sensor value from a magnetic sensor element without employing an A/D converter.

According to the present invention, a plurality of semiconductor magnetic sensors is connected in a ring form to provide a ring circuit in a magnetic sensor apparatus. Each of the semiconductor magnetic sensors deflects carriers flowing through the channel region by using the Hall-effect, the amount of the carriers which flow through the separated drain region, namely, the current value, changes in correspondence with the strength of the magnetic field to be detected.

In the ring circuit, one of separated drain regions of a pre-staged semiconductor magnetic sensor, which is connected to a power supply, is connected the gate electrode of a post-staged semiconductor magnetic sensor. As a consequence, when the pre-staged semiconductor magnetic sensor is brought into the ON-state, namely when a voltage is applied to the gate electrode of the pre-staged semiconductor magnetic sensor, a current starts to flow between the drain region and the source region. As a result, since the potentials of the separated drain regions are approximated from the power supply potential to the ground potential, no drive voltage is applied to the gate electrode of the post-staged semiconductor magnetic sensor, so that this post-staged semiconductor magnetic sensor is brought into the OFF-state.

Each of the semiconductor magnetic sensors which constitute the ring circuit may function as an inverting circuit. If a level of an inputted voltage is a high level (Hi-level), then a voltage having a low level (Lo-level) is outputted. On the other hand, if a voltage having a Lo-level is conversely inputted, then a voltage having a Hi-level is outputted.

In this case, when a drive voltage is applied to the gate electrode of a certain semiconductor magnetic sensor, since carriers may flow through the channel region of this semiconductor magnetic sensor, a current may flow between the source and the drain of this semiconductor magnetic sensor. At this time, the current values of the separated drain regions changes in response to the strength of the magnetic field to be detected. On the other hand, in the post-staged semiconductor magnetic sensor, the power supply voltage is being applied to the gate electrode thereof just before the drive voltage is applied to the gate electrode of the pre-staged semiconductor magnetic sensor.

Under this condition, if the current starts to flow through the pre-staged semiconductor magnetic sensor, then delay is caused until the potential of this gate electrode is lowered due to stray capacitance of the gate electrode and of the wiring line which connects the separated drain electrodes to the gate electrode. This delay time changes in response to a magnitude of such a current which flows through the drain region connected to the ground since the pre-staged semiconductor magnetic sensor is turned on. That is, when the current value flowing through one of the separated drain regions in the pre-staged semiconductor sensor is higher than the current value flowing through the other drain region, the electron charges stored in the stray capacitance can be quickly discharged, so that the delay time until the post-staged semiconductor magnetic sensor is turned off may be shortened. On the other hand, when the current value flowing through one of the separated drain regions in the pre-staged semiconductor sensor is lower than the current value flowing through the other drain region, the delay time may be prolonged.

As a consequence, the current values flowing through the separated drain regions changes in response to the strength of the magnetic field to be detected, and further, the delay time changes in response to this current value. This delay time is defined after the pre-staged semiconductor magnetic sensor is turned on until the post-staged semiconductor magnetic sensor is turned off. As a result, the strength of the magnetic field to be detected may be detected based upon this delay time.

Since a plurality of semiconductor sensors forms the ring circuit, the delay time may be obtained from propagation conditions of such a pulse signal during a predetermined time period, which is inverted from the Hi-level to the Lo-level, or from the Lo-level to the Hi-level by each of the semiconductor magnetic sensors employed in the ring circuit.

As a consequence, the propagation condition of the pulse signal in the ring circuit for a predetermined time period is detected. As this propagation condition, it may be expressed as digital data from a total ringing time of the pulse signal in the ring circuit, and a total number of semiconductor magnetic sensors which have executed the inverting operations during a predetermined time period. As a consequence, since a plurality of semiconductor magnetic sensors are connected to each other in the ring shape, the digital data produced in response to the strength of the magnetic field to be detected can be obtained without employing the A/D converter.

BRIEF DESCRIPTION OF THE DRAWINGS

The above and other objects, features and advantages of the present invention will become more apparent from the following detailed description made with reference to the accompanying drawings. In the drawings.

DETAILED DESCRIPTION OF THE PREFERRED EMBODIMENT

First Embodiment

Figure 1A:
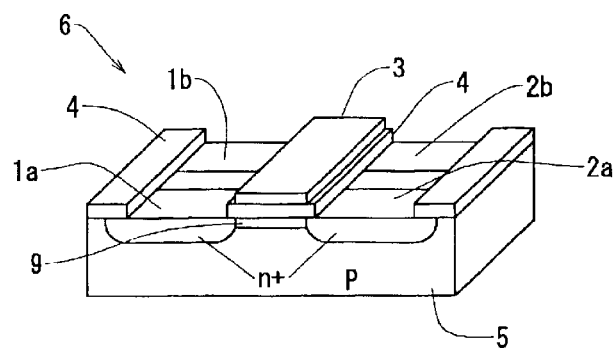
FIG. 1A is a perspective view showing a structure of a semiconductor magnetic sensor (MAGFET) according to a first embodiment of the present invention.

Referring first to FIG. 1A, a semiconductor magnetic sensor including a field effect transistor (MAGFET) 6 has $n^+$ source regions 1a, 1b, and $n^+$ drain regions 2a, 2b that are formed on a major surface of a p type semiconductor substrate 5. Also, a gate electrode 3 is formed between the $n^+$ source regions 1a, 1b and $n^+$ drain regions 2a, 2b in order to induce a channel region 9 via an insulating film 4 such as a silicon oxide film and the like. Thus, the MAGFET 6 owns an nMOS type FET.

The $n^+$ source regions 1a and 1b are separated into two regions, and the $n^+$ drain regions 2a and 2b are separated into two regions. These two separated $n^+$ source regions 1a and 1b are formed in such a manner that these source regions 1a, 1b own the same shapes, and are located adjacent to each other. Also, the two separated $n^+$ drain regions 2a and 2b are made equal to each other, and are fabricated in similar shapes to those of the $n^+$ source regions 1a and 1b, and also, are located adjacent to each other.

A constant current circuit is connected via two source contacts (not shown) to the $n^+$ source regions 1a and 1b which are separated into two regions in order that a total value of currents which flow through the respective $n^+$ source regions 1a and 1b becomes constant. The two $n^+$ drain regions 2a and 2b are connected via two drain contacts (not shown) to a common power supply, so that the same voltages are applied to the $n^+$ drain regions 2a and 2b. The two source contacts are made in contact to the two $n^+$ source regions 1a and 1b, respectively, whereas the two drain contacts are made in contact with the two $n^+$ drain regions 2a and 2b, respectively.

In the case that a magnetic field is not applied to the MAGFET 6 having the above structure, carriers may flow from the $n^+$ source regions 1a and 1b only to the $n^+$ drain regions 2a and 2b, which constitute a pair structure with respect to the $n^+$ source regions 1a and 1b. In this case, since the two $n^+$ drain source regions 1a, 1b, and the two $n^+$ drain regions 2a, 2b are made in the completely the same shapes, and also widths of the respective source/drain regions 1a, 1b, 2a, 2b which are faced to the channel region 9 are made equal to each other, current capacities of the respective regions 1a, 1b, 2a, 2b are equivalent to each other. As a consequence, the carriers which flow from the $n^+$ source region 1a to the $n^+$ drain region 2a are substantially equal to the carriers which flow from the $n^+$ source region 1b to the $n^+$ drain region 2b.

However, when a magnetic field is applied to the major surface of the p type semiconductor substrate 5 in the vertical direction in FIG. 1A, carriers which flow through the channel region 9 induced by the gate electrode 3 receive the Lorentz force, and thus are deflected. A portion of the deflected carriers will flow from the $n^+$ source region 1b to the $n^+$ drain region 2a, or from the $n^+$ source region 1a to the $n^+$ drain region 2b depending on a direction of the magnetic field. It should be noted that FIG. 1B exemplifies such an example that the carriers flow from the $n^+$ source region 1b to the $n^+$ drain region 2a. In other words, in the MAGFET 6, a difference between currents corresponding to the strength of a magnetic field to be detected is produced between the $n^+$ source region 1a to the $n^+$ drain region 2a, and between the $n^+$ source region 1b and the $n^+$ drain region 2b, which constitute paired structures, due to the Hall-effect.

Figure 1B:
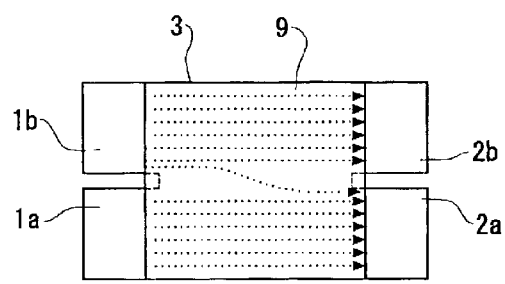
FIG. 1B is a schematic view showing directions of carriers which flow through a channel region of a MAGFET shown in FIG. 1A.

At this time, regarding the $n^+$ source region 1a and the $n^+$ drain region 2a, in the case shown in FIG. 1B, since the magnetic field is applied, the amount of carriers flowing through the drain region 2a is increased. As a result, the value of currents which flow from the $n^+$ drain region 2a to the $n^+$ source region 1a is increased, as compared with that of the case that the magnetic field is not applied to the MAGFET 6.

Figure 2:
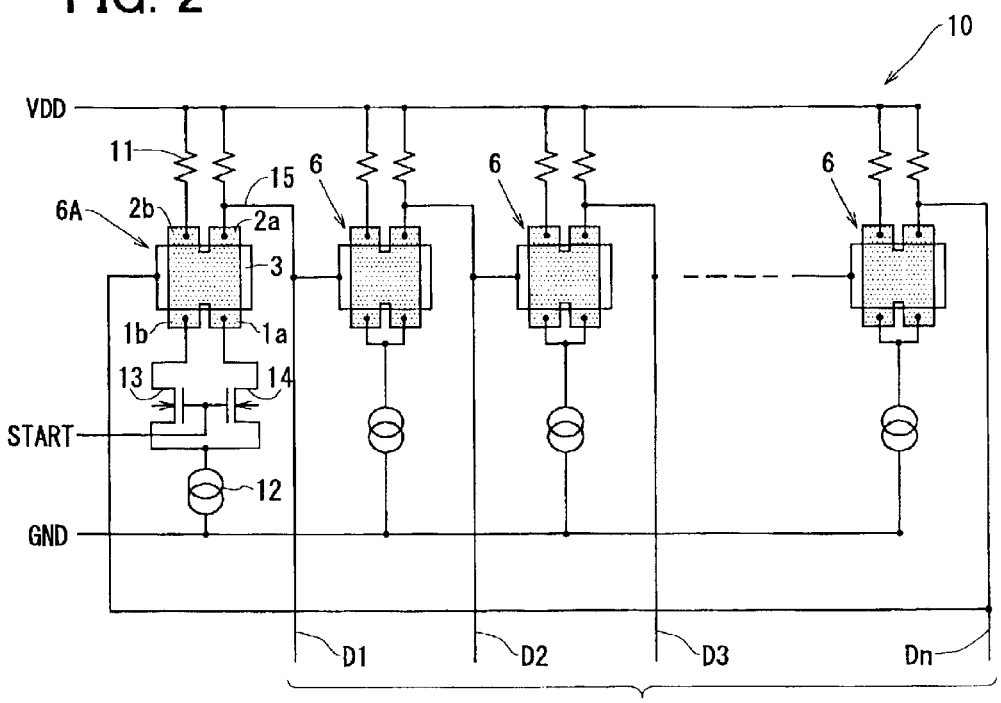
FIG. 2 is a circuit diagram showing an arrangement of a ring circuit in the first embodiment.

In the magnetic sensor apparatus according to this first embodiment, an odd number of MAGFETs 6 are connected to each other, so that a ring circuit 10 is constructed as shown in FIG. 2. In each of the MAGFETs 6, the drain regions 2a and 2b are connected via respective load resistors 11 to a common power supply VDD, and the source regions 1a and 1b are grounded via a constant current circuit 12 to the ground GND.

These MAGFETs 6 are formed on a common semiconductor substrate. As a result, when a magnetic field is applied along the vertical direction to a surface of this semiconductor substrate where the MAGFETs 6 are formed, carriers which flow through the channel regions of the respective MAGFETs 6 are deflected in the same direction.

As to a mutual connecting relationship among the respective MAGFETs 6, one drain region 2a of a pre-staged MAGFET 6 is connected to a gate electrode 3 of a post-staged MAGFET 6 by using a wiring line 15. It should be noted that with respect to all of the MAGFETs 6, the drain region 2a which is located close to the post-staged MAGFET 6 among the separated drain regions 2a and 2b is connected to the gate electrode 3 of the post-staged MAGFET 6. Also, the source regions 1a, 1b, the drain regions 2a, 2b, and the gate electrode 3a of the MAGFETs 6 which constitute the ring circuit 10 are formed in substantially the same shape. As a consequence, when the magnetic field is applied to the respective MAGFETs 6, increased amount or decreased amount of the current value is substantially equal to each other in the drain regions 2a of the respective MAGFETs 6 connected to the gate electrodes 3 of the post-staged MAGFETs 6.

If it is assumed that one of the odd-numbered MAGFETs 6 which constitute the ring circuit 10 is brought into the ON state, a drive voltage is applied to the gate electrode 3 of this one MAGFET 6. In this case, since the channel region is induced by applying a drive voltage to this MAGFET 6, a current may flow between the drain regions 2a, 2b and the source regions 1a, 1b. As a consequence, since potentials of the drain regions 2a and 2b are substantially equal to the ground potential, the drive voltage is not applied to the gate electrode 3 of one post-staged MAGFET 6. As a result, the post-staged MAGFET 6 with respect to such an MAGFET 6 which is brought into the ON state is brought into the OFF state.

On the other hand, when the pre-staged MAGFET 6 is set under OFF state, the channel region is not induced between the source and the drain of this MAGFET 6, and thus, no carrier flows in this source-to-drain path. As a consequence, the potential at the separated drain region 2a becomes substantially equal to the power supply potential VDD. Accordingly, since this power supply potential is applied to the gate electrode 3 of the post-staged MAGFET 6, this post-staged MAGFET 6 is brought into the ON state.

If a level of a voltage inputted to the gate electrode 3 of each of the MAGFETs 6 which constitute the ring circuit 10 is high (Hi-level: power supply potential), then this MAGFET 6 outputs a voltage having a Lo-level (ground potential) via the wiring line 15 to a post-staged MAGFET 6. However, when a voltage having a Lo-level is applied to the gate electrode 3 of each of these MAGFETs 6, then this MAGFET 6 outputs a voltage having a Hi-level to the post-staged MAGFET 6. In other words, each of these MAGFETs 6 which are connected to each other in the above manner so as to constitute the ring circuit 10 may function as an inverting circuit (inverter).

It should also be noted that in the ring circuit 10, the wiring line 15 connected to the drain regions 2a of the respective MAGFETs 6 are connected not only to the gate electrodes 3 of the post-staged MAGFETs 6, but are connected to both a pulse selector 21 and a counter 23 (FIG. 5) as output "D1" to "Dn" of the ring circuit 10.

It is noted that a time delay occurs after either a voltage having a Hi-level or a voltage having a Lo-level is inputted to the gate electrode 3 of one MAGFET 6 until such a voltage having a level opposite to the level of the inputted voltage is outputted from the wiring line 15 connected to one drain region 2a of this MAGFET 6. As a consequence, a signal (pulse signal) inverted by one MAGFET 6 is transferred in a time sequential manner to the respective MAGFETs 6 employed in the ring circuit 10. Then, since the ring circuit 10 is constituted by the odd number of MAGFETs 6, when the pulse signal is circulated, or ringed one turn within the ring circuit 10, a voltage having a level different from the level of the previously-applied pulse signal is inputted to the gate electrode of each of these MAGFETs 6. As a consequence, each operating condition of these MAGFETs 6 is switched from either the ON state or the OFF state into either the OFF state or the ON state every time the pulse signal is inputted. The propagation conditions of the pulse signals are maintained within the ring circuit 10.

Figure 5:
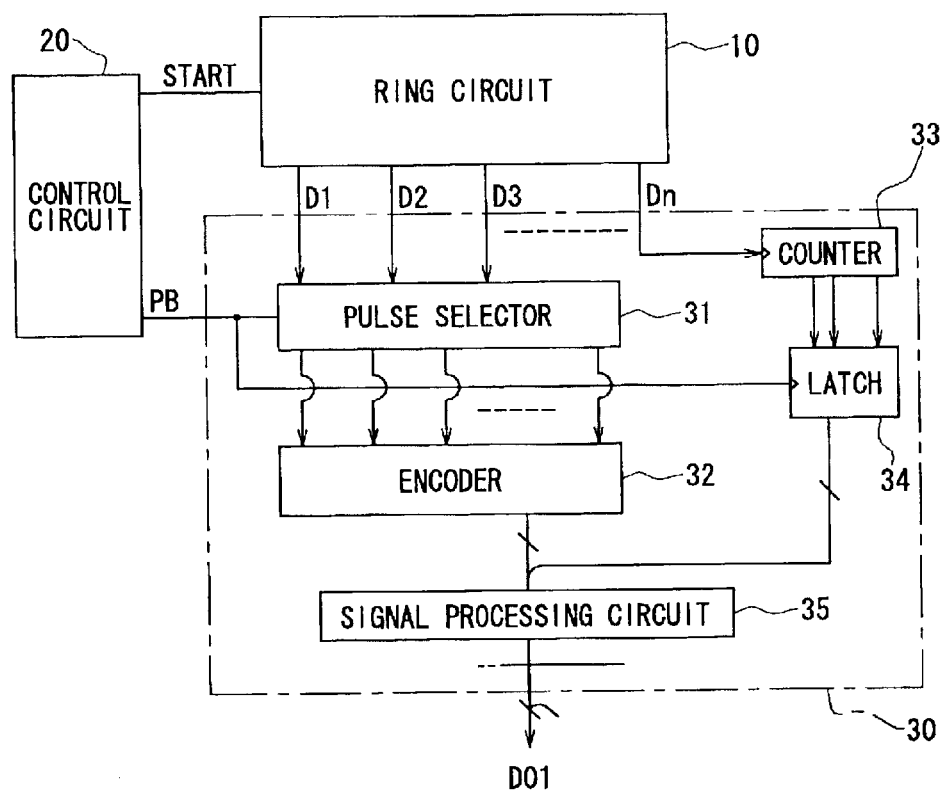
FIG. 5 is a schematic block diagram showing an output circuit which produces digital data "DO1" in response to a magnetic field strength from the output of the ring circuit.

In this first embodiment, both a transistor 13 and a transistor 14 are connected between the ground GND and one MAGFET (initiating MAGFET) 6A among the odd number of MAGFET 6 which constitute the ring circuit 10. In other words, these transistors 13 and 14 are connected to the separated source regions 1a and 1b of the initiating MAGFET 6A, respectively. These transistors 13 and 14 are manufactured as general-purpose MOSFETs, and own at least current capacity higher than or equal to the current capacities of the source regions 1a and 1b of the initiating MAGFET 6A. To these MOSFETs 13 and 14, a start signal "START" is entered from a control circuit 20 (FIG. 5).

Since the MOSFETs 13 and 14 are connected to the source regions 1a and 1b of the initiating MAGFET 6A, this MAGFET 6A continuously outputs the voltage having the Hi-level to the gate electrode 3 of the post-staged MAGFET 6 irrespective of the ON/OFF states of the initiating MAGFET 6A unless these MOSFETs 13 and 14 are brought into the ON states. That is, when voltage signals having Hi-levels are inputted to the respective gates of the MOSFETs 13 and 14 of the post-staged MAGFET 6, these MOSFETs 13 and 14 output voltage signals having Lo-levels to the post-staged MAGFET 6, and thus, may function as NAND gate elements. As a consequence, while the level of the start signal is under the Lo-level, the operation conditions of the respective MAGFETs 6 are not changed, but also the pulse signal is not propagated in the ring circuit 10.

In operation of the ring circuit 10, since the start signal having the Hi-level is inputted from the control circuit 20 into the gates of the MOSFETs 13 and 14, the voltage signal having the Lo-level is applied from the initiating MAGFET 6A to the post-staged MAGFET 6, so that the propagation of the pulse signal is commenced.

In this case, the respective MAGFETs 6 and the initiating MAGFET 6A, which constitute the ring circuit 10, are brought into ON states when the voltage signal having the Hi-level is inputted to the gate electrode 3, and thus, carriers may flow into the channel region of this MAGFET 6, or the channel region of the initiating MAGFET 6A. As a result, a current may flow between the source and the drain of either this MAGFET 6 or the initiating MAGFET 6A. At this time, as previously explained, the value of the current flowing through the separated drain region 2a is changed in response to the strength of the magnetic field applied thereto.

On the other hand, in the post-staged MAGFET 6 as to this MAGFET 6 which is brought into the ON state, the power supply voltage is applied to the gate electrode 3 thereof just before the pre-staged MAGFET 6 is brought into the ON state. Under this condition, when a current starts to flow through the source-to-drain path of the pre-staged MAGFET 6, the potential at the gate electrode 3 of the post-staged MAGFET 6 is lowered. In this case, this gate potential is lowered in accordance with a predetermined changing rate (gradient) due to a stray capacitance of the wiring line 15 for connecting the separated drain electrode 2a to the gate electrode 3, and also another stray capacitance of the gate electrode 3. As a result, after the voltage signal having the Lo-level having been inputted from the pre-staged MAGFET 6 until such a level at which the post-staged MAGFET 6 is brought into the OFF state, the time delay is caused until the potential of the gate electrode 3 is lowered.

This delay time changes in response to a magnitude of a current which flows through the separated drain region 2a of the pre-staged MAGFET 6. If a value of a current is high which flows through the separated drain region 2a of the pre-staged MAGFET 6 connected to the gate electrode 3 of the post-staged MAGFET 6, then electron charges stored in the stray capacitance can be quickly discharged. As a result, the delay time defined until the post-staged MAGFET 6 is brought into the OFF state may be shortened. On the other hand, if a value of a current flowing through this separated drain region 2a is low, then the delay time is prolonged.

Figure 3:
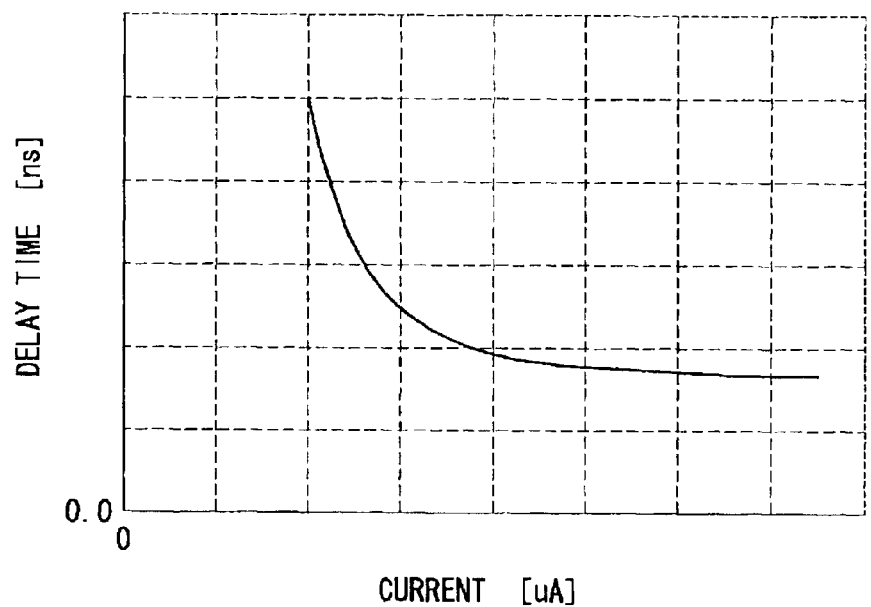
FIG. 3 is a graph graphically showing a relationship between a current value of the MAGFET and delay time defined until the MAGFET generates an output thereof which is inverted with respect to an input thereof.

FIG. 3 is a graph for graphically representing a relationship between a value of a current flowing between the source and the drain regions of the MAGFET 6 and delay time defined until the MOGFET 6 outputs an inverting signal as an inverter, whose level is inverted with respect to a level of an input signal. As described above, when the current value is low, the delay time becomes long, whereas the delay time becomes short while the current value is increased. It should be understood that while the magnitude of a basic current value is set by a constant current circuit 12 (FIG. 5), the magnitude of this basic current value is changed in response to the magnitude of a magnetic field, and also the magnitude of the current value itself may be arbitrarily set by the constant current circuit 12.

As previously described, the delay time of the MAGFET 6 functioning as the inverter is changed due to the value of the current flowing through the drain region 2a, and furthermore the value of the current flowing through this drain region 2a is changed in response to the strength of the magnetic field. As a consequence, the strengths of the magnetic fields applied to the respective MAGFETs 6 can be detected based upon this delay time.

Next, an output circuit which outputs a strength of a magnetic field as digital data from the delay time of the MAGFET 6 is described.

Figure 4:
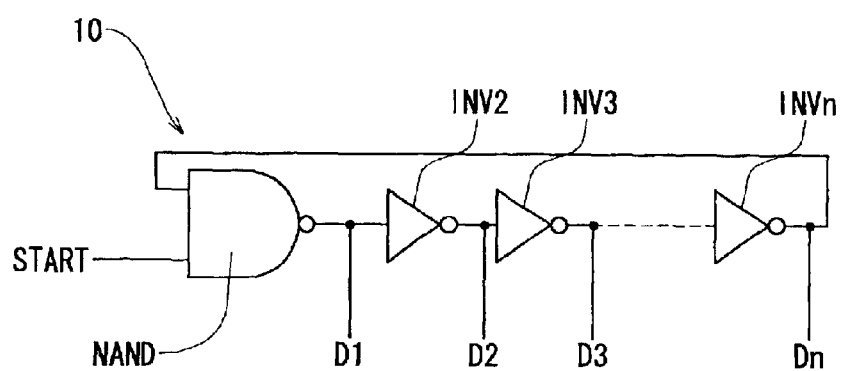
FIG. 4 is a circuit diagram showing an equivalent circuit of the ring circuit in the first embodiment.

Sine the MAGFETs 6 are coupled to each other in the ring shape so as to constitute the ring circuit 10, delay time of each of the MAGFETs 6 may be acquired from propagation conditions of pulse signals during a preselected time period in the ring circuit 10. FIG. 4 indicates an equivalent circuit of the ring circuit 10. As indicated in FIG. 4, the ring circuit 10 is constructed by connecting one NAND gate "NAND" to an even number of inverters "INV" in a ring shape.

Next, FIG. 5 shows a circuit diagram of the output circuit which outputs propagation conditions of pulse signals within a preselected time period as digital data. As indicated in FIG. 5, the output circuit is constructed with a control circuit 20 and a digital data producing circuit 30. The control circuit 20 produces both the starting signal "START" and the pulse signal "PB." This pulse signal PB is outputted after a predetermined time period has passed from this starting signal START. The digital data producing circuit 30 produces digital data indicative of the propagation conditions of the pulse signal from output signals D1 to Dn of the ring circuit 10.

The digital data producing circuit 30 is provided with a counter 33 and a latch circuit 34. The counter 33 counts a ringing time of the pulse signal within the ring circuit 10 based upon a total level inverting number of the output signal Dn of the inverter INVn which is provided at a pre-stage of the NAND gate employed in the ring circuit 10, The counter 33 then produces binary digital data. The latch circuit 14 latches the digital data outputted from the counter 33. Also, the digital data producing circuit 30 is equipped with a pulse selector 31 and an encoder 32.

The pulse selector 31 fetches the output signals "D1" to "Dn-1" of the respective inverting circuits (NAND gate and inverters INV) which constitute the ring circuit 10, extracts a pulse signal which is ringed within the ring circuit 10 from output levels of these fetched output signals D1 to Dn-1. It then produces a signal indicative of a position of this pulse signal. The encoder 32 generates digital data corresponding to the output signal from the pulse selector 31. It should be noted that ringing positions of the pulse signal within the ring circuit 10 may be detected from such an output signal which continuously outputs voltages having the same levels among the output signals D1 to Dn-1.

Furthermore, this digital data producing circuit 30 is provided with a signal processing circuit 35. This signal processing circuit 35 inputs therein both the digital data from the latch circuit 34 as more significant bits bit and the digital data from the encoder 32 as less significant bits. It then adds the data of the less significant bits to the data of the more significant bits, so that binary digital data "DO1" may be produced. This binary digital data DO1 indicates ringing positions of the pulse signal within the ring circuit 10 within a time period from the starting signal START up to the pulse signal PB.

It should also be understood that both the latch circuit 34 and the pulse selector 31 are operated by receiving the pulse signal PB outputted from the control circuit 20. Since the output circuit arranged in the above manner is substantially equivalent to the pulse phase difference coding circuit employed in the A/D converting circuit which has previously been proposed in U.S. Pat. No. 5,396,247 (Japanese Laid-open Patent No. Hei-5-259907), operations thereof will be briefly explained as follows.

When the level of the starting signal START outputted from the control circuit 20 becomes a Hi-level, the ring circuit 10 commences the ringing operation of the pulse signal, and rings the pulse signal during a time period that the level of the starting signal START is at the Hi-level. This ringing time is counted by the counter 23, and the count result is latched by the latch circuit 34 at a time instant when the level of the pulse signal outputted from the control circuit 23 becomes a Hi-level.

When the level of the pulse signal PB outputted from the control circuit 4 becomes a Hi-level, the pulse selector 31 detects a ringing position of the pulse signal with in the ring circuit 10, and also the encoder 32 produces digital data corresponding to this detected ringing position. As a consequence, the signal processing circuit 35 produces binary digital data "DO1" corresponding to the ringing position of the pulse signal within a predetermined time period defined from the rising edge of the starting signal START up to the rising edge of the pulse signal PB based upon the digital data derived from the encoder 32 and the digital data derived from the latch circuit 34.

As a consequence, in accordance with the output circuit of this first embodiment, the digital data DO1 indicative of the ringing position of the pulse signal of the ring circuit 10 within a predetermined time period defined by both the start signal START and the pulse signal PB can be produced. In other words, in this first embodiment, since the structure made by coupling the odd-numbered MAGFETs 6 in the ring shape is employed without using an A/D converter in the ring circuit 10, the digital data can be obtained in response to the strengths of the magnetic fields applied to the respective MAGFETs 6. Alternatively, except for that the predetermined time period is defined by both the start signal START and the pulse signal PB, since two sets of these pulse signals PB are outputted while the level of the start signal START is kept at the Hi-level, the predetermined time period may be defined based upon these tow pulse signals PB.

Figure 6:
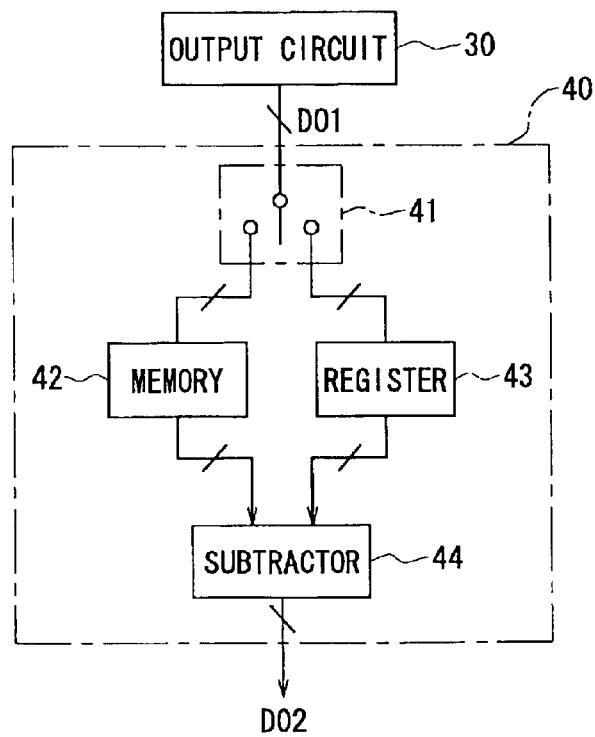
FIG. 6 is a schematic block diagram showing a correction circuit for subtracting digital data "DOR" when the magnetic field is zero with respect to the digital data "DO1" outputted from the output circuit.

In this case, since the output circuit 30 produces the digital data DO1 which merely indicates the ringing position of the pulse signal within the ring circuit 10 during a predetermined time period, this digital data DO1 does not directly represent the magnetic field strength. As a consequence, for instance, such a digital data "DO2" which directly indicates strength of a magnetic field may be produced by employing a correction circuit 40 as shown in FIG. 6.

The correction circuit 40 is constructed with a memory 42, a register 43, a selecting switch 41, and a subtractor 44. Both the memory 42 and the register 43 store therein the digital data DO1 outputted from the output circuit 30. The selecting switch 41 is selectively operated in response to a switching signal supplied from the control circuit 20 in such a way that the storing destination of the digital data DO1 outputted from the output circuit 30 is switched into the memory 42, or the register 43. The subtractor 44 receives the digital data DO1 stored in the memory 42 and also the digital data DO1 stored in the register 43 respectively, and performs subtraction between both the digital data, and thereafter, outputs this subtraction result as the digital data DO2.

In the correction circuit 40 arranged in this manner, if a magnetic field is not effected to the MAGFETs 6 which constitute the ring circuit 10, both the starting signal START and the pulse signal PB are outputted from the control circuit 20, and also a switching signal is outputted from the control circuit 20 to the selecting switch 41 in such a manner that the storing destination of the digital data DO1 outputted from the output circuit 30 is directed to the memory 42. As a result, such a digital data (DOR) is stored in the memory 42, while this digital data "DOR" indicates a ringing position of the pulse signal within a predetermined time period when a magnetic field applied to the MAGFETs 6 which constitute the ring circuit 10 is zero.

Thereafter, the control circuit 20 switches the selecting switch 41 in such a manner that the storing destination of the digital data DO1 outputted from the output circuit 30 is directed to the register 43. As a consequence, such a digital data DO1 may be temporarily stored in the register 43, while this digital data DO1 indicates a ringing position of a pulse signal which is measured when the MAGFETs 6 for constituting the ring circuit 10 is positioned under such an environment where a magnetic field to be detected is effected.

Then, the subtractor 44 subtracts the digital data "DOR" from the digital data "DO1" to output a subtracted result as the digital data "DO2." The first digital data "DOR" is stored in the memory 42, and indicates the ringing position of the pulse signal when the magnetic field is zero. The second digital data "DO1" is temporarily stored in the register 43, and represents the ringing position of the pulse signal which has been influenced by the delay time produced in accordance with the strength of the magnetic field to be detected.

While the correcting circuit 40 employs as the reference value the ringing position of the pulse signal within the ringing circuit 10 in the predetermined time period when the magnetic field to be detected is zero, this correcting circuit 40 produces such a digital data "DO2" indicative of the difference between one ringing position of the pulse signal and another ringing position of the pulse signal when the magnetic field to be detected is effected. As a result, this digital data D02 directly indicates the delay times of the respective MAGFETs 6 employed in the ring circuit 10, namely directly represents the strength of the magnetic field to be detected.

Furthermore, in the case that the ring circuit 10 is formed, the ringing positions of the pulse signal when the magnetic field is zero are slightly different from each other, depending upon the respective products, due to manufacturing variations of the respective MAGFETs 6 and the load resistor 11. However, since the correcting circuit 40 is employed, since the digital data DOR indicative of the ringing positions of the pulse signal when the magnetic field is zero can be produced for every product, the accuracy of the digital data which directly indicates the delay times of the MAGFETs 6 can be improved.

It should be understood that in order to obtain the digital data corresponding to the ringing position of the pulse signal when the magnetic field to be detected is zero, the following alternative measure other than the above correcting circuit 40 may be employed. That is, for instance, while another independent ring circuit is formed by using MOSFETs having similar current capacities to those of the MAGFETs 6 which constitute the above ring circuit 10 in such a manner that a length of a wiring line and a total connection number of these MOSFETs are equal to those of the MAGFETs 6, the pulse signals may be ringed in both the ring circuit made by the MAGFETs 6 and the ring circuit made by the MOSFETs at the same time points and only for the same time period.

Since both the MOSFETs and the MAGFETs own the similar structures, when a ring circuit is constructed of the MOSFETs in the above manner, it can be regarded by that this ring circuit may execute the ringing operation of the pulse signal under such an environment that the magnetic field is zero. As a result, while digital data corresponding to a ringing position of a pulse signal in the ring circuit made by the MOSFETs is employed as a reference value, since this digital data is subtracted from another digital data which indicates a ringing position of a pulse signal in the ring circuit 10 made of the MAGFETs 6, such a digital data which directly indicates a strength of a magnetic field to be detected may be acquired.

Furthermore, in this case, since both the ring circuit constituted by the MAGFETs and the ring circuit constituted by the MOSFETs execute the ringing operations of the pulse signals under the same environment, a change in the delay times can also be canceled, which is caused by a change in the environmental temperatures. As a consequence, the digital data corresponding to the magnetic strength can be acquired in higher precision.

Second Embodiment

A magnetic sensor apparatus according to a second embodiment is slightly different in a ring circuit configuration from the first embodiment.

Figure 7:
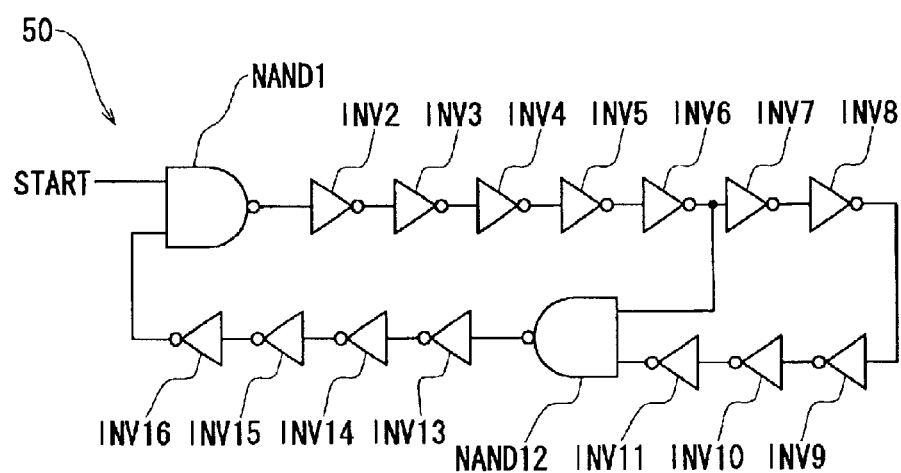
FIG. 7 is a circuit diagram showing an equivalent circuit of a ring circuit according to a second embodiment of the present invention.

As shown in FIG. 7, a ring circuit 50 employed in the second embodiment is constructed with 2 sets of NAND gates "NAND", and 14 sets of inverters "INV." A starting signal (START) is inputted from a control circuit (not shown) to an input terminal (initiating input terminal) which is not connected to an inverter "INV16" of a NAND gate "NAND1." Furthermore, the output signal of an inverter "INV6" is inputted to an input terminal (resetting terminal) which is not connected to an inverter "INV11" of another NAND gate "NAND12." Similar to the first embodiment, the NAND gate NAND1 is constructed as an input terminal of the starting signal START by connecting an MOSFET to the MAGFETs 6 in a series manner. On the other hand, since a pulse signal which is propagated through the ring circuit 50 is entered into both input terminals of the NAND gate NAND12, this NAND gate NAND12 is constructed by connecting two MAGFETs 6 to an MOSFET in a series manner.

In operation, when the level of the starting signal is a Lo-Level (initial condition), since the output of the NAND gate NAND1 becomes a Hi-level, outputs of even-staged inverters INV2, INV4, - - - INV16 counted from this first NAND gate NAND1 become Lo-Levels, and outputs of odd-staged inverters INV3, INV5, - - - INV15 become Hi-levels.

Under this initial condition, since the output signal of the inverter INV6 is at a Lo-level, which is inputted into the resetting terminal of the NAND gate NAND12, this NAND gate NAND12 outputs a Hi-level signal, although this NAND gate NAND12 is connected to the even stage. As a result, as to the inverters INV13 to INV16 which are connected to subsequent stages of this NAND gate NAND12, outputs from the odd-staged inverters INV13, INV15 become Lo-levels, whereas outputs from the even-staged inverters INV14, INV16 become Hi-levels.

The condition of the NAND gate NAND1 into which the starting signal START is inputted is not changed and a signal having a Hi-level is continuously outputted therefrom while the level of the starting signal START is the Lo-level, so that the ring circuit 50 becomes stable under the above-described condition.

Next, when the level of the starting signal START is changed from the Lo-level to a Hi-level, since a signal having the Hi-level is inputted from the inverter INV16 also to another input terminal of the NAND gate NAND1, the level of the output from the NAND gate NAND1 is inverted from the Hi-level into a Lo-level. As a result, a pulse signal is started to be propagated within the ring circuit 50. As a consequence, the output levels of the succeeding-staged inverters INV2, INV3, - - -, are sequentially inverted, so that the output levels of the odd-staged inverters INV3, INV5, - - -, are changed from the Hi-levels to Lo-levels, whereas the output levels of the even-staged inverters INV2, INV4, - - -, are changed from the Lo-levels to Hi-levels. It should be understood that such a pulse is referred to as a "main pulse." That is, this main pulse is produced in response to this change of the starting signal START, and this main pulse is sequentially ringed as a falling output of the odd-staged NAND gate NAND1 and falling outputs of the odd-staged inverters INV3, INV5, - - -, and also as a rising output of the even-staged NAND gate NAND12 and rising outputs of the even-staged inverters INV2, INV4, - - - .

Then, when this main pulse reaches the inverter INV6 and then the output level of this inverter INV6 is inverted from the Lo-level to a Hi-level, since the output level of the inverter INV11 is still at the Hi-level, the levels of two input signals of the NAND gate NAND12 become Hi-levels, so that the output level of the NAND gate NAND12 is inverted from the Hi-level into a Lo-level. It should also be noted that such a main pulse will be referred to as a "reset pulse." That is, this main pulse is entered from the resetting terminal to the NAND gate NAND12, and then is inverted by this NAND gate NAND12. This inverted main pules is sequentially ringed within the ring circuit 50 as rising outputs of the odd-staged NAND gate NAND1 and of the inverters INV13, INV15, - - - , and as falling outputs of the even-staged NAND gate NAND12 and of the inverters INV14, INV116, - - - . This reset pulse is ringed within the ring circuit 50 in combination with the main pulse generated from the NAND gate NAND1.

Also, thereafter, this main pulse is sequentially inverted by the respective inverters INV7, INV8, - - -, subsequent to the inverter INV6, and then, the inverted main pulse is transferred. Since the output level of the inverter INV11 is inverted from the Hi-level to a Lo-level by the main pulse, a signal having a Lo-level is inputted into another input terminal of the NAND gate NAND12, not the resetting terminal thereof. At this time, since the signal having the Hi-level is entered from the inverter INV6 into this resetting terminal, the output level of the NAND gate NAND12 is inverted from the Lo-level to a Hi-level by the main pulse. Also, the main pulse is transferred to the respective inverters INV13, INV14, - - - , subsequent to the NAND gate NAND12.

The reason why the level of the output signal of the inverter INV6 is still at the Hi-level when the main pulse is reached via the inverters INV7 through INV11 to the NAND gate NAND12 is given as follows. That is, a total number of the inverters defined from the inverter INV7 to the inverter INV11 is equal to 5, whereas a total number of the inverters including NAND gate defined from the NAND gate NAND12 to the inverter INV6 is equal to 11, so that the total number of the inverters through which the main pulse passes is smaller than that for the inverters and the NAND gate. As a result, the main pulse may be inputted into the NAND gate NAND12 at a time instant earlier than such a time instant when the reset pulse is transferred from the NAND gate NAND12 to the inverter INV6.

On the other hand, the reset pulse which is produced by the NAND gate NAND12 is again reached via the respective inverters INV13, INV14, - - - , including the NAND gate NAND1 to the inverter INV6, so that this reset pulse causes the signal level of the resetting terminal of the NAND gate NAND12 to be inverted from the Hi-level to the Lo-level. However, at this time, since the level of the input signal supplied from the inverter INV11 of the NAND gate NAND12 has already become the Lo-level by the main pulse, the output level of the NAND gate NAND12 is not changed. Thereafter, the reset pulse is sequentially transferred via the normal route of the ring circuit 50, namely from the inverter INV6 to the inverter INV11 up to the NAND gate NAND12.

Then, when the reset pulse reaches the inverter INV11, the level of the output signal of the inverter INV11 with respect to the NAND gate NAND12 is inverted from the Lo-level to a Hi-level Also, at the substantially same time, the main pulse reaches the inverter INV6, so that the level of the input signal for the resetting terminal of the NAND gate NAND12 is also inverted from the Lo-level to a Hi-level. As a consequence, the NAND gate NAND12 outputs such a reset pulse having a Lo-level at such a time instant when the inverter INV11 outputs a signal having a Hi-level by the reset pulse, and also, the inverter INV6 outputs a signal having a Hi-level by the main pulse.

Subsequently, the above operations are repeatedly carried out, and both the reset pulse and the main pulse are ringed within the ring circuit 50. Also, when a series of such operations is desired to be stopped, if the level of the starting signal START is changed from the Hi-level to the Lo-level, then this operation is returned to the above-described initial condition.

As previously explained, when the even number of inverting circuits(both NAND gates and inverters) are coupled to each other in the ring form, the input/output levels of the respective inverting circuits normally become different from each other, so that the entire circuit becomes stable. However, in the ring circuit 50 of this embodiment, since the two pulse signals having the different generation timing are ringed on the same ring path, the output level of the NAND gate NAND1 is inverted by the reset pulse before the main pulse generated by the own NAND gate NAND1 is returned. Also, the output level of the NAND gate NAND12 is inverted by the main pulse before the reset pulse generated by the own NAND gate NAND12 is returned. As a consequence, the two main/reset pulse signals may be ringed within the ring circuit 50, while the entire circuit is not brought into the stable condition.

Then, while both the output circuit and the correcting circuit are employed in the first embodiment, propagation conditions of the pulse signals within a predetermined time period are obtained based upon the total ringing numbers of both the main pulse and the reset pulse, and also, for instance, the ringing position of the main pulse. As a result, both the digital data DO1 made in response to the strength of the magnetic field and the digital data DO2 which directly indicates the strength of the magnetic field can be acquired.

It should also be understood that the ring circuit 50 shown in the second embodiment indicates one connection example in the case that the ring circuit is constituted by the even number of inverting circuits (both NAND gates and inverters). However, the connection method for the NAND gates and the inverters is not limited to this connection example.

In summary, with respect to such an MAGFET (first resetting MAGFET) located at the position in which the even number of inverters are connected between the NAND gate NAND1 along the propagation direction of the pulse signal, another MAGFET (second resetting MAGFET) is series-connected so as to constitute the NAND gate NAND2. In the inverters connected between the NAND gate NAND1 and the NAND gate NAND2, the output of the even-numbered inverter counted from the NAND gate NAND1 may be connected to the gate electrode of this second resetting MAGFET. As a result, both the main pulse and the reset pulse maybe ringed within the ringing circuit due to the effect similar to the above-explained effect, so that it is possible to avoid such a case that the ring circuit is brought into the stable condition.

In the above embodiments, both the n$^+$ source regions 11a, 11b and the n$^+$ drain regions 12a, 12b are separated into two regions respectively as to the MAGFET 6. Alternatively, the n$^+$ source regions may not be separated. Even in this case, in the separated n$^+$ drain regions, increase/decrease amounts of currents may be produced in response to the strength of a magnetic field.

Furthermore, the semiconductor magnetic sensor made by the nMOS type FETs is manufactured. Alternatively, a pMOS type FET structure may be employed as this semiconductor sensor.

What is claimed is:

1. A magnetic sensor apparatus comprising:
   a ring circuit including a plurality of semiconductor magnetic sensors connected to each other in a ring shape; and
   an output circuit for detecting a propagation condition of a pulse signal within the ring circuit during a predetermined time period, and outputting digital data corresponding to a magnitude of an applied magnetic field based upon a detection result of the propagation condition,
   wherein each semiconductor magnetic sensor is constructed with source regions, drain regions, and a gate electrode in such a manner that at least the drain regions are separated, and the gate electrode controls channel regions formed between the source regions and the separated drain regions, whereby amounts of carriers flowing through the separated drain regions are changed in correspondence with a magnitude of the magnetic field when the magnetic field is applied to the carriers flowing through the channel regions, and
   wherein one of the separated drain regions of a pre-staged semiconductor magnetic sensor is connected to the gate electrode of a post-staged semiconductor magnetic sensor, so that each of the semiconductor magnetic sensors constitutes an inverting circuit.

2. A magnetic sensor apparatus as in claim 1,
   wherein the drain regions are connected to a power supply and the source regions are connected to a ground; and
   wherein the plurality of semiconductor magnetic sensors are formed on a same plane of a common semiconductor substrate, so that the carriers flowing through the respective channel regions are deflected in the same direction by the magnetic field.

3. A magnetic sensor apparatus as in claim 2,
   wherein one of the separated drain regions of each semiconductor magnetic sensor connected to the gate electrode of the post-staged semiconductor magnetic sensor has a similar current increasing/decreasing trend with respect to the magnetic field.

4. A magnetic sensor apparatus as in claim 1,
   wherein the source regions, the drain regions, and the channel regions of the plurality of semiconductor magnetic sensors are formed in a same size, so that values of currents, which flow through one of the separated drain regions of a pre-staged semiconductor magnetic sensor connected to the gate electrode of the post-staged semiconductor magnetic sensor, become equal to each other among the semiconductor magnetic sensors.

5. A magnetic sensor apparatus as in claim 1,
   wherein one of the plurality of semiconductor magnetic sensors is connected in series with field effect transistors connected to a ground, and an initiating signal for propagating a pulse signal within the ring circuit is inputted to gate electrodes of the field effect transistors, so that the one of the semiconductor magnetic sensors operates as an initiating magnetic sensor.

6. A magnetic sensor apparatus as in claim 1,
   wherein the output circuit outputs the digital data corresponding to the magnetic field based upon a difference amount between a detected propagation condition and a reference value, which corresponds to a propagation condition of a pulse signal within the ring circuit for a predetermined time period when the magnetic field is zero.

7. A magnetic sensor apparatus as in claim 1,
   the ring circuit is constructed with an odd number of semiconductor magnetic sensors connected to each other in a ring shape.

8. A magnetic sensor apparatus as in claim 5,
   wherein the ring circuit is constructed with an even number of the semiconductor magnetic sensors connected to each other in a ring shape, wherein two sorts of pulse signals are propagated at same time within the ring circuit in such a manner that, while a semiconductor magnetic sensor located at a position where the even number of the semiconductor magnetic sensors are connected between the initiating magnetic sensor are connected along propagation directions of the pulse signals is employed as a first resetting semiconductor magnetic sensor, a second resetting semiconductor magnetic sensor is series-connected between the first resetting semiconductor magnetic sensor and a ground, and wherein one of the separated drain regions of an even-numbered semiconductor magnetic sensor, which is counted from the initiating magnetic sensor among the semiconductor magnetic sensors connected between the initiating magnetic sensor and the first resetting semiconductor magnetic sensor, is connected to the gate electrode of the second resetting semiconductor magnetic sensor.

* * * * *